(12) United States Patent
Hsieh et al.

(10) Patent No.: US 9,070,871 B2
(45) Date of Patent: Jun. 30, 2015

(54) METHOD FOR FABRICATING MAGNETORESISTIVE RANDOM ACCESS MEMORY ELEMENT

(71) Applicant: NANYA TECHNOLOGY CORP., Tao-Yuan Hsien (TW)

(72) Inventors: Chun-I Hsieh, Taoyuan County (TW); Chang-Rong Wu, New Taipei (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/529,176

(22) Filed: Oct. 31, 2014

(65) Prior Publication Data

US 2015/0064805 A1   Mar. 5, 2015

Related U.S. Application Data

(60) Division of application No. 13/902,877, filed on May 27, 2013, now Pat. No. 8,916,392, which is a continuation of application No. 13/401,850, filed on Feb. 22, 2012, now Pat. No. 8,535,954, which is a division of application No. 12/750,716, filed on Mar. 31, 2010, now Pat. No. 8,149,614.

(51) Int. Cl.
| | |
|---|---|
| *H01L 21/00* | (2006.01) |
| *H01L 43/12* | (2006.01) |
| *B82Y 25/00* | (2011.01) |
| *B82Y 40/00* | (2011.01) |
| *H01F 10/32* | (2006.01) |
| *H01F 41/30* | (2006.01) |
| *H01L 43/08* | (2006.01) |

(Continued)

(52) U.S. Cl.
CPC ............... *H01L 43/12* (2013.01); *B82Y 25/00* (2013.01); *B82Y 40/00* (2013.01); *H01F 10/3254* (2013.01); *H01F 41/308* (2013.01); *H01L 43/08* (2013.01); *H01L 43/02* (2013.01); *H01L 43/10* (2013.01)

(58) Field of Classification Search
CPC .... B82Y 25/00; B82Y 40/00; H01F 10/3254; H01F 41/308; H01L 43/08; H01L 43/12; H01L 43/02; H01L 43/10
USPC ................................ 438/3; 257/421; 365/158
See application file for complete search history.

(56) References Cited

U.S. PATENT DOCUMENTS

| | | | | |
|---|---|---|---|---|
| 3,391,483 | A | * | 7/1968 | Marlman ........................ 43/84 |
| 3,768,152 | A | * | 10/1973 | Swanke et al. ................. 29/596 |
| 3,906,369 | A | * | 9/1975 | Pitman et al. .................. 341/20 |

(Continued)

FOREIGN PATENT DOCUMENTS

| | | |
|---|---|---|
| TW | I225716 | 12/2004 |
| TW | 200945643 | 11/2009 |

*Primary Examiner* — Vongsavanh Sengdara
(74) *Attorney, Agent, or Firm* — Winston Hsu; Scott Margo

(57) ABSTRACT

A magnetoresistive random access memory (MRAM) element includes a bottom electrode embedded in a first insulating layer; an annular reference layer in a first via hole of a second insulating layer on the first insulating layer, the annular reference layer being situated above the bottom electrode; a first gap fill material layer filling the first via hole; a barrier layer covering the annular reference layer, the second insulating layer and the first gap fill material layer; an annular free layer in a second via hole of a third insulating layer on the second insulating layer, the annular free layer being situated above the annular reference layer; and a top electrode stacked on the annular free layer.

10 Claims, 9 Drawing Sheets

(51) Int. Cl.
*H01L 43/02* (2006.01)
*H01L 43/10* (2006.01)

(56) References Cited

U.S. PATENT DOCUMENTS

| | | | |
|---|---|---|---|
| 5,541,868 A * | 7/1996 | Prinz .............................. 365/98 |
| 6,391,483 B1 | 5/2002 | Zhu |
| 6,768,152 B2 | 7/2004 | Higo |
| 6,906,369 B2 | 6/2005 | Ross |
| 7,116,575 B1 * | 10/2006 | Katti ............................. 365/158 |
| 7,307,876 B2 * | 12/2007 | Kent et al. ..................... 365/171 |
| 2003/0169147 A1 * | 9/2003 | Higo ........................... 338/32 R |
| 2004/0094785 A1 * | 5/2004 | Zhu et al. ...................... 257/295 |
| 2007/0075304 A1 * | 4/2007 | Chang et al. ....................... 257/3 |
| 2009/0191367 A1 * | 7/2009 | Chen ............................ 428/34.1 |
| 2011/0121417 A1 * | 5/2011 | Li et al. .......................... 257/421 |
| 2011/0149639 A1 * | 6/2011 | Carter et al. .................. 365/148 |
| 2011/0188301 A1 * | 8/2011 | Wang et al. .................... 365/158 |
| 2011/0194341 A1 | 8/2011 | Gaidis |
| 2011/0310660 A1 | 12/2011 | Yamada |

\* cited by examiner

METHOD FOR FABRICATING MAGNETORESISTIVE RANDOM ACCESS MEMORY ELEMENT

CROSS REFERENCE TO RELATED APPLICATIONS

This application is a division of U.S. application Ser. No. 13/902,877 filed May 27, 2013, which is a continuation of U.S. application Ser. No. 13/401,850 filed Feb. 22, 2012, which itself is a division of U.S. application Ser. No. 12/750,716 filed Mar. 31, 2010. All of the above-mentioned applications are included in their entirety herein by reference.

BACKGROUND OF THE INVENTION

1. Field of the Invention

The present invention relates generally to the field of non-volatile memory technology. More particularly, the present invention relates to a magnetoresistive random access memory (MRAM) element with improved magnetization efficiency, and method for fabricating the same.

2. Description of the Prior Art

As known in the art, magnetoresistive random access memory (MRAM) is a non-volatile computer memory technology. MRAM is six times faster than the current industry-standard memory, dynamic RAM (DRAM). It is almost as fast as static RAM (SRAM) and is much faster and suffers less degradation over time than flash memory. Unlike these technologies, MRAM uses magnetism instead of electrical charges to store data.

In general, the MRAM cells include a data layer and a reference layer. The data layer is composed of a magnetic material and during a write operation the magnetization of the data layer can be switched between two opposing states by an applied magnetic field and thus binary information can be stored. The reference layer usually is composed of a magnetic material in which the magnetization is pinned so that the magnetic field, which is applied to the data layer and in part penetrates the reference layer, is of insufficient strength to switch the magnetization in the reference layer.

MRAM is physically similar to DRAM in makeup, although often does not require a transistor for the write operation. However, the most basic MRAM cell suffers from the half-select problem, which limits cell sizes. To be worth putting into wide production, however, it is generally believed that MRAM will have to move to the 65 nm size of the most advanced memory devices, which will require the use of spin-torque-transfer (STT) technology.

Spin-torque-transfer (STT) or Spin Transfer Switching, uses spin-aligned ("polarized") electrons to directly torque the domains. Specifically, if the electrons flowing into a layer have to change their spin, this will develop a torque that will be transferred to the nearby layer. This lowers the amount of current needed to write the cells, making it about the same as the read process.

However, the prior art MRAM has several drawbacks. For example, the gap fill process of the reference layer using physical vapor deposition (PVD) methods becomes problematic when the aspect ratio of the gap is greater than 2 for example. Besides, as the cell packing density increases, the interference between neighboring cells is not negligible. Therefore, there is a need in this industry to provide an improved method for fabricating the MRAM devices in order to avoid the aforementioned PVD gap fill problem, as well as an improved MRAM structure that is capable of eliminating interference or coupling between neighboring cells.

SUMMARY OF THE INVENTION

To address these and other objects and in view of its purposes, the present invention provides a magnetoresistive random access memory (MRAM) element comprising a bottom electrode embedded in a first insulating layer; an annular reference layer in a first via hole of a second insulating layer on the first insulating layer, the annular reference layer being situated above the bottom electrode; a first gap fill material layer filling the first via hole; a barrier layer covering the annular reference layer, the second insulating layer and the first gap fill material layer; an annular free layer in a second via hole of a third insulating layer on the second insulating layer, the annular free layer being situated above the annular reference layer; and a top electrode stacked on the annular free layer.

According to another aspect, the invention provides a method for fabricating a MRAM element, comprising: providing a substrate; depositing a first insulating layer on the substrate; forming a bottom electrode in the first insulating layer; depositing a second insulating layer on the first insulating layer and the bottom electrode; forming a first via hole in the second insulating layer; forming an annular reference layer in the first via hole; filling the first via hole with a first gap fill material layer; depositing a barrier layer on the second insulating layer, the annular reference layer and the first gap fill material layer; depositing a third insulating layer on the barrier layer; forming a second via hole in the third insulating layer; forming an annular free layer in the second via hole; filling the second via hole with a second gap fill material layer; and forming a top electrode on the annular free layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
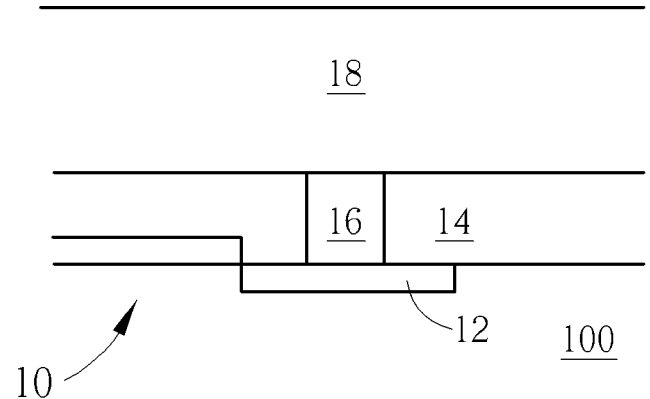
FIGS. 1-8 are schematic, cross-sectional diagrams illustrating a method for fabricating MRAM element in accordance with one preferred embodiment of this invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention.

However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

The term "horizontal" as used herein is defined as a plane parallel to the conventional major plane or surface of the semiconductor substrate, regardless of its orientation. The term "vertical" refers to a direction perpendicular to the horizontal as just defined. Terms, such as "on", "above", "below", "bottom", "top", "side"(as in "sidewall"), "higher", "lower", "over", and "under", are defined with respect to the horizontal plane FIGS. 1-8 are schematic, cross-sectional diagrams illustrating a method for fabricating a magnetoresistive random access memory (MRAM) element in accordance with one preferred embodiment of this invention.

As shown in FIG. 1, a substrate 100 is provided. The substrate 100 may be a semiconductor substrate including but not limited to silicon substrate, silicon substrate with an epitaxial layer, SiGe substrate, silicon-on-insulator (SOI) substrate, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. A semiconductor switching device 10 such as a field effect transistor is fabricated on a main surface of the substrate 100.

An insulating layer 14 is deposited on a main surface of the substrate 100 and covers the semiconductor switching device 10. A bottom electrode 16 is inlaid in the insulating layer 14 and is electrically connected to a terminal 12 such as a source or a drain of the semiconductor switching device 10. The bottom electrode 16 may be composed of metals such as tungsten, titanium, titanium nitride, tantalum or tantalum nitride, copper, gold, platinum, alloys thereof, or silicides thereof. It is to be understood that in other cases the bottom electrode 16 may be electrically connected to other types of control components. An insulating layer 18 overlies the insulating layer 14 and the bottom electrode 16. For example, the insulating layer 18 may be a silicon oxide film that can be formed by conventional chemical vapor deposition (CVD) methods.

Figure 2:
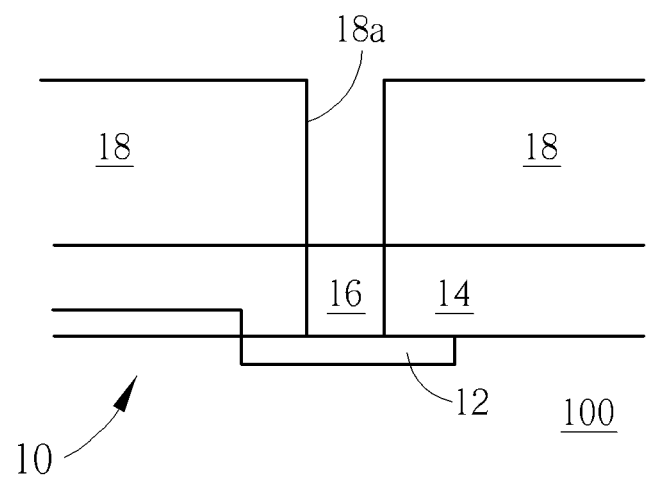

As shown in FIG. 2, after the deposition of the insulating layer 18, a via etching process such as a plasma dry etching process is carried out to form a via hole 18a in the insulating layer 18. Via hole 18a exposes a top surface of the bottom electrode 16. According to one embodiment, via hole 18a has substantially vertical sidewall with respect to the main surface of the substrate 100. Via hole 18a may have a circular shape, an oval shape, a rectangular shape or a polygonal shape when viewed from the top.

Figure 3:
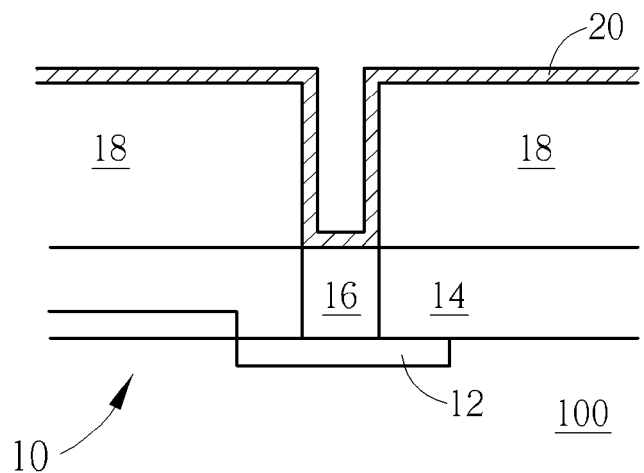

As shown in FIG. 3, after the formation of via hole 18a in the insulating layer 18, a magnetic material layer 20 is conformally deposited on the insulating layer 18 and on the interior surface of via hole 18a by physical vapor deposition (PVD) or atomic layer deposition (ALD) methods. The magnetic material layer 20 is a thin film with uniform thickness and the magnetic material layer 20 does not fill up the via hole 18a. According to one embodiment, the magnetic material layer 20 is a pinned magnetic layer, which may be composed of a material including but not limited to NiFe, NiFeCo, CoFe, CoFeB, Fe, Co, Ni, alloys or compounds thereof, and/or other magnetic materials.

Figure 4:
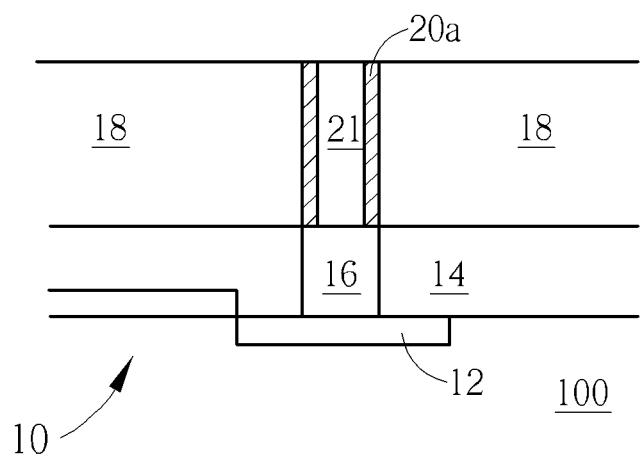

Subsequently, as shown in FIG. 4, an anisotropic dry etching process is carried out to etch the magnetic material layer 20 thereby forming an annular sidewall spacer 20a extending vertically along the sidewall of the via hole 18a. The magnetic material layer 20 outside the via hole 18a is removed to reveal the top surface of the insulating layer 18. After the etching back of the magnetic material layer 20, an insulating layer 21 such as silicon oxide is deposited over the substrate 100. The insulating layer 21 fills up the remaining space in the via hole 18a and covers the sidewall spacer 20a and the top surface of the insulating layer 18. Thereafter, a chemical mechanical polishing (CMP) is performed to remove the insulating layer 21 outside the via hole 18a, a top portion of the sidewall spacer 20a and a top portion of the insulating layer 18. The remaining sidewall spacer 20a acts as a reference layer of the MRAM stack.

Figure 5:
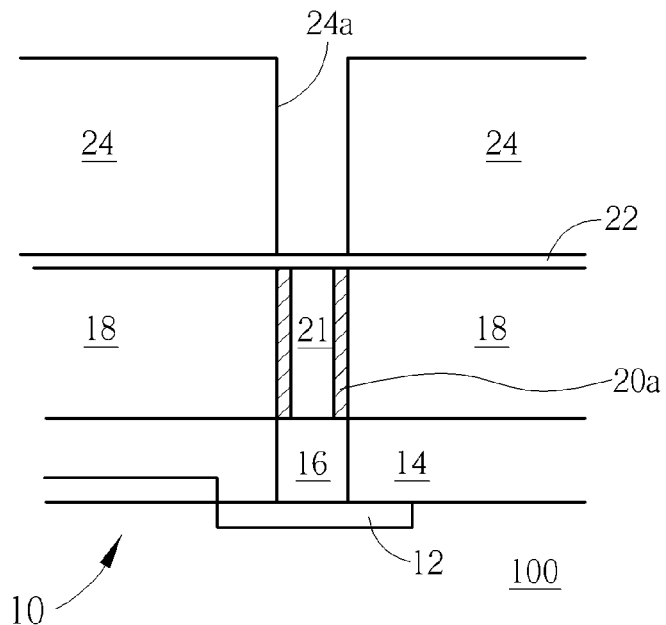

As shown in FIG. 5, a barrier layer 22 such as MgO or $Al_2O_3$ is deposited on the insulating layer 18 and the insulating layer 21. An insulating layer 24 such as silicon oxide is then deposited on the barrier layer 22. After the deposition of the insulating layer 24, a via etching process such as a plasma dry etching process is carried out to form a via hole 24a in the insulating layer 24. The via hole 24a exposes a portion of the barrier layer 22 and is situated directly above the sidewall spacer 20a. According to the embodiment, the via hole 24a has substantially vertical sidewall with respect to the main surface of the substrate 100. The via hole 24a may have a circular shape, an oval shape, a rectangular shape or a polygonal shape when viewed from the top.

Figure 6:
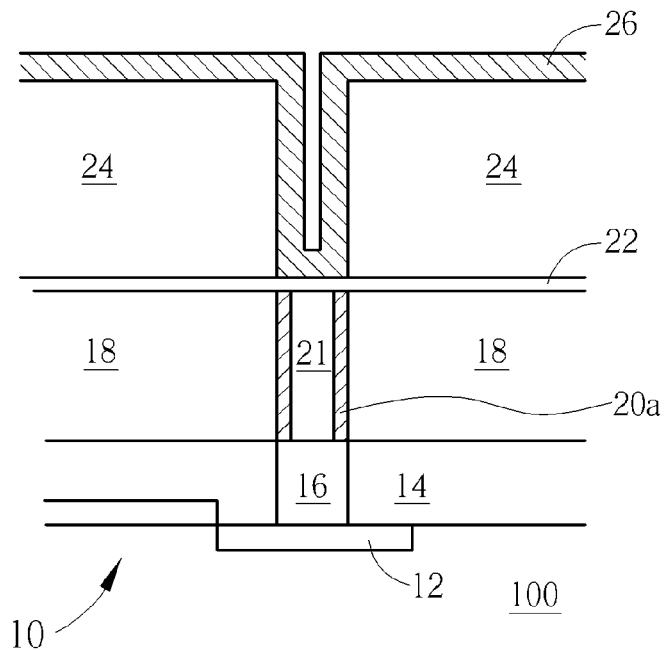

As shown in FIG. 6, after the formation of the via hole 24a in the insulating layer 24, a magnetic material layer 26 is conformally deposited on the insulating layer 24 and on the interior surface of the via hole 24a by physical vapor deposition (PVD) or atomic layer deposition (ALD) methods. The magnetic material layer 26 is a thin film with uniform thickness and the magnetic material layer 26 does not fill up the via hole 24a. According to the embodiment, the magnetic material layer 26 has a thickness that is greater than that of the magnetic material layer 20. According to the embodiment, the magnetic material layer 26 may be composed of a material including but not limited to NiFe, NiFeCo, CoFe, CoFeB, Fe, Co, Ni, alloys or compounds thereof, and/or other magnetic materials.

Figure 7:
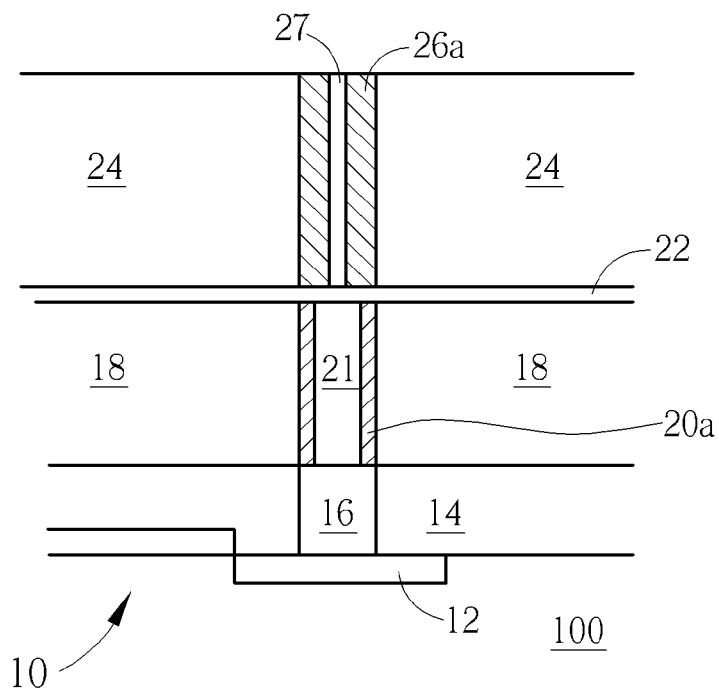

As shown in FIG. 7, an anisotropic dry etching process is carried out to etch the magnetic material layer 26 thereby forming an annular sidewall spacer 26a extending vertically along the sidewall of the via hole 24a. The magnetic material layer 26 outside the via hole 24a is removed to reveal the top surface of the insulating layer 24. After the etching back of the magnetic material layer 26, an insulating layer 27 such as silicon oxide is deposited over the substrate 100. The insulating layer 27 fills up the remaining space in the via hole 24a and covers the sidewall spacer 26a and the top surface of the insulating layer 24. Thereafter, CMP is performed to remove the insulating layer 27 outside the via hole 24a, a top portion of the sidewall spacer 26a and a top portion of the insulating layer 24. The remaining sidewall spacer 26a acts as a free layer (or data layer) of the MRAM stack.

Figure 8:
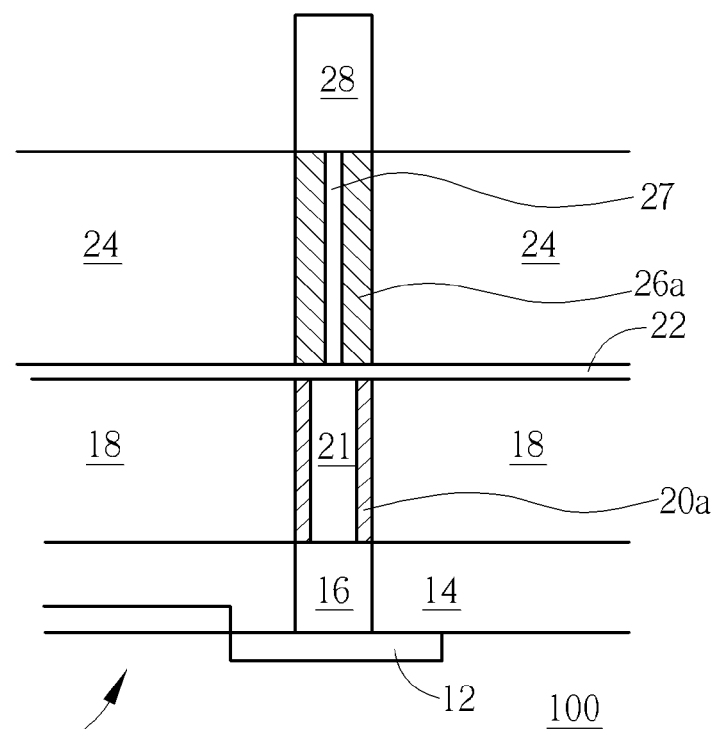

As shown in FIG. 8, after the formation of the annular free layer of the MRAM stack, a top electrode 28 is formed on the sidewall spacer 26a. A bit line (not shown) may be electrically connected to the top electrode 28. The top electrode 28 may be composed of metals such as tungsten, titanium, titanium nitride, tantalum or tantalum nitride, copper, gold, platinum, alloys thereof, or silicides thereof. It is to be understood that in other cases the bottom electrode 16 may be electrically connected to other types of control components. Since the reference layer 20b and the free layer 26a are both annular, the close magnetic loop provides high magnetization efficiency and the interference between neighboring cells can be avoided.

FIGS. 9-13 are schematic, cross-sectional diagrams illustrating a method for fabricating MRAM element in accordance with another preferred embodiment of this invention, wherein like numeral numbers designate like elements, layers or regions.

Figure 9:
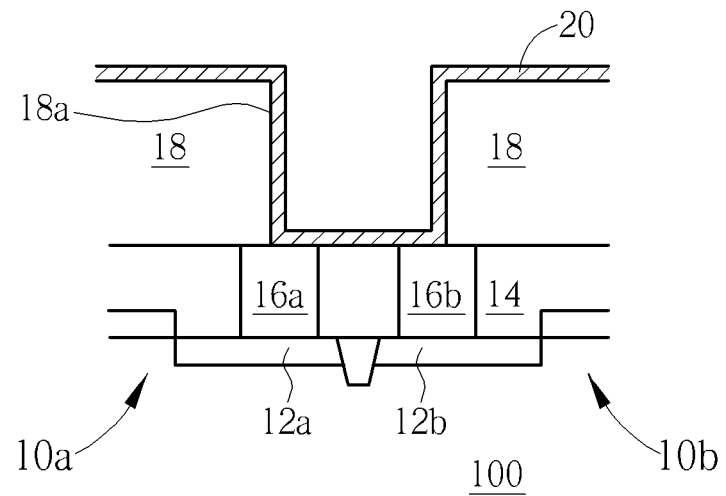
FIGS. 9-13 are schematic, cross-sectional diagrams illustrating a method for fabricating MRAM element in accordance with another preferred embodiment of this invention.

As shown in FIG. 9, likewise, a substrate 100 is provided. The substrate 100 may be a semiconductor substrate including but not limited to silicon substrate, silicon substrate with an epitaxial layer, SiGe substrate, silicon-on-insulator (SOI) substrate, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. A semiconductor switching device 10a and a semiconductor switching device 10b such as field effect transistors are fabricated on the main surface of the substrate 100.

An insulating layer 14 is deposited on the main surface of the substrate 100 and covers the semiconductor switching devices 10a and 10b. A bottom electrode 16a and a bottom electrode 16b are inlaid in the insulating layer 14 and may be electrically connected to a terminal 12a and a terminal 12b respectively of the semiconductor switching devices 10a and 10b. The bottom electrodes 16a and 16b may be composed of metals such as tungsten, titanium, titanium nitride, tantalum or tantalum nitride, copper, gold, platinum, alloys thereof, or silicides thereof. It is to be understood that in other cases the bottom electrodes 16a and 16b may be electrically connected to other types of control components. An insulating layer 18 overlies the insulating layer 14 and the bottom electrodes 16a and 16b. For example, the insulating layer 18 may be a silicon oxide film that can be formed by conventional chemical vapor deposition (CVD) methods.

After the deposition of the insulating layer 18, a via etching process such as a plasma dry etching process is carried out to form a via hole 18a in the insulating layer 18. The via hole 18a exposes a top surface of the bottom electrodes 16a and 16b and a portion of the insulating layer 18 between the bottom electrodes 16a and 16b. According to the embodiment, the via hole 18a has substantially vertical sidewall with respect to the main surface of the substrate 100. The via hole 18a may have a circular shape, an oval shape, a rectangular shape or a polygonal shape when viewed from the top.

After the formation of the via hole 18a in the insulating layer 18, a magnetic material layer 20 is conformally deposited on the insulating layer 18 and on the interior surface of the via hole 18a by PVD or ALD methods. The magnetic material layer 20 is a thin film with uniform thickness and the magnetic material layer 20 does not fill up the via hole 18a. According to the embodiment, the magnetic material layer 20 is a pinned magnetic layer, which may be composed of a material including but not limited to NiFe, NiFeCo, CoFe, CoFeB, Fe, Co, Ni, alloys or compounds thereof, and/or other magnetic materials.

Figure 10:
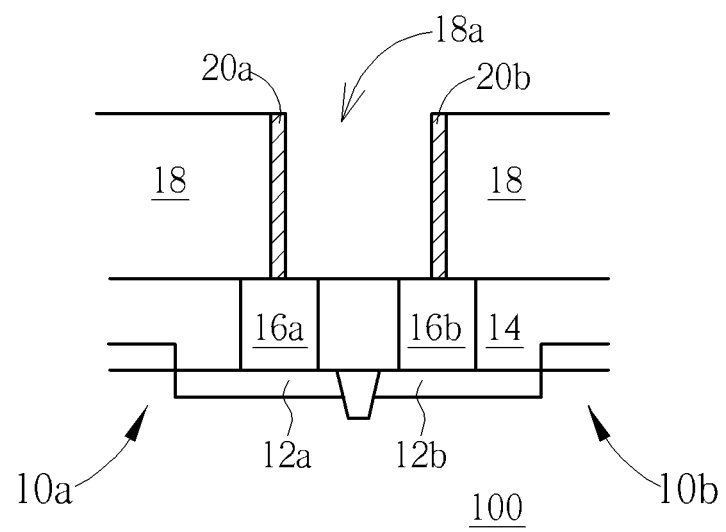

Subsequently, as shown in FIG. 10, an anisotropic dry etching process is carried out to etch the magnetic material layer 20 thereby forming a sidewall spacer 20a and a sidewall spacer 20b extending vertically along two opposite sidewalls of the via hole 18a. The sidewall spacer 20a is situated directly above the bottom electrode 16a and the sidewall spacer 20b is situated directly above the bottom electrode 16b. The sidewall spacer 20a is separated from the sidewall spacer 20b. The magnetic material layer 20 outside the via hole 18a is removed to reveal the top surface of the insulating layer 18. The sidewall spacers 20a and 20b act as a reference layer.

Figure 11:
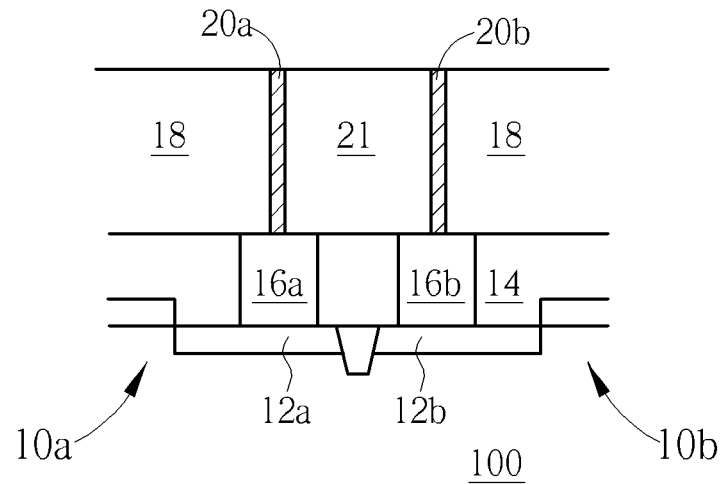

As shown in FIG. 11, an insulating layer 21 such as silicon oxide is then deposited over the substrate 100. The insulating layer 21 fills up the remaining space in the via hole 18a and covers the sidewall spacers 20a, 20b and the top surface of the insulating layer 18. Thereafter, the insulating layer 21 outside the via hole 18a, a top portion of the sidewall spacer 20a and a top portion of the insulating layer 18 are removed by CMP.

Figure 12:
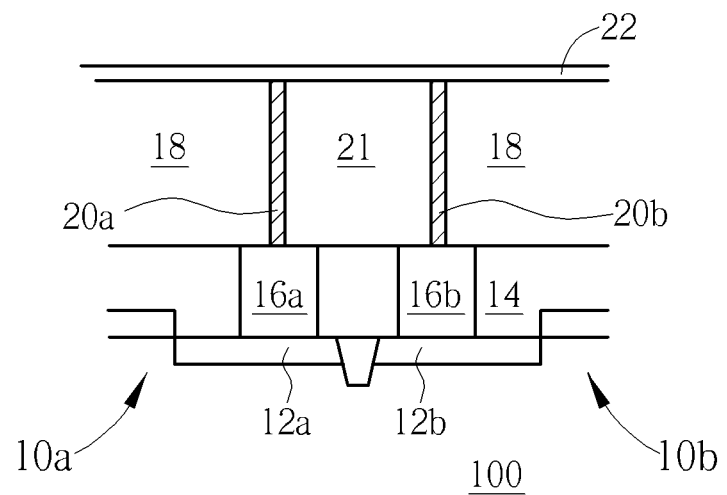

As shown in FIG. 12, after CMP, a barrier layer 22 such as MgO or $Al_2O_3$ is deposited on the insulating layer 18 and the insulating layer 21.

Figure 13:
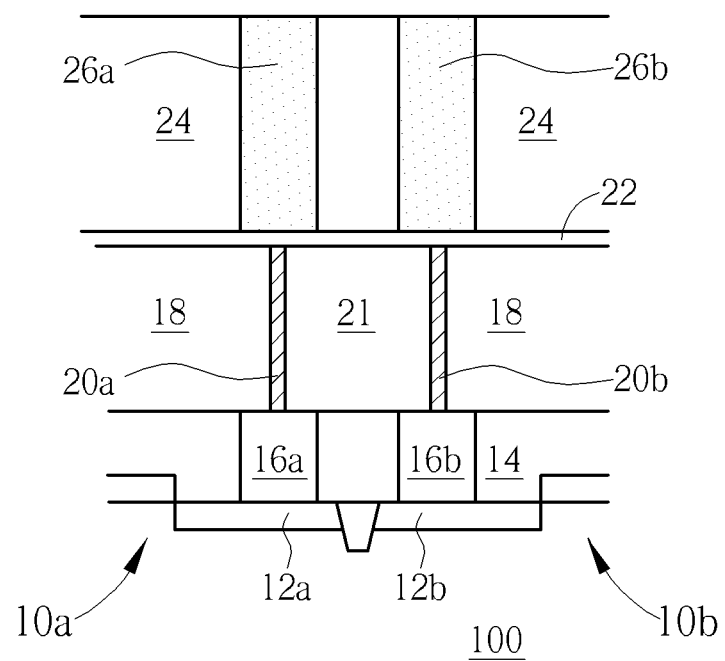

As shown in FIG. 13, an insulating layer 24 such as silicon oxide is then deposited on the barrier layer 22. A free layer 26a and a free layer 26b are inlaid in the insulating layer 24. The free layer 26a is situated directly above the sidewall spacer 20a and the free layer 26b is situated directly above the sidewall spacer 20b. For example, a magnetic material layer is first deposited on the barrier layer 22 in a blanket manner. The magnetic material layer is then patterned to form the free layers 26a and 26b. Thereafter, the insulating layer 24 is deposited to cover the free layers 26a and 26b and the barrier layer 22. The excess insulating layer 24 may be removed by CMP. The thin sidewall spacers 20a and 20b that act as a reference layer provide high magnetization efficiency.

FIGS. 14-18 are schematic diagrams illustrating a method for fabricating MRAM element in accordance with still another preferred embodiment of this invention, wherein like numeral numbers designate like elements, layers or regions.

Figure 14:
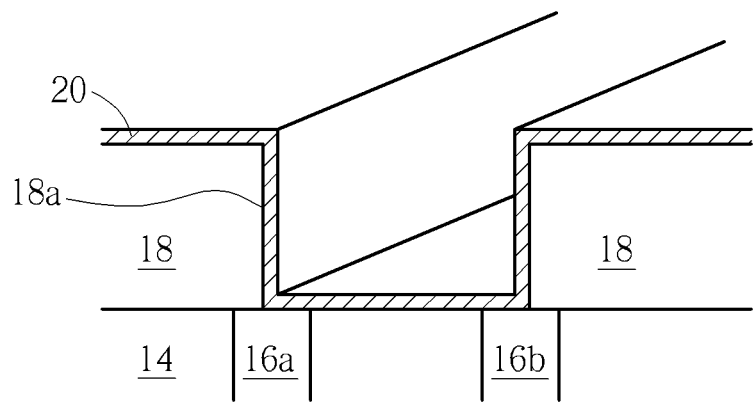
FIGS. 14-18 are schematic diagrams illustrating a method for fabricating MRAM element in accordance with still another preferred embodiment of this invention.

As shown in FIG. 14, likewise, an insulating layer 14 is provided on a substrate (not shown). A bottom electrode 16a and a bottom electrode 16b are inlaid in the insulating layer 14. The bottom electrodes 16a and 16b may be composed of metals such as tungsten, titanium, titanium nitride, tantalum or tantalum nitride, copper, gold, platinum, alloys thereof, or silicides thereof. An insulating layer 18 overlies the insulating layer 14 and the bottom electrodes 16a and 16b. For example, the insulating layer 18 may be a silicon oxide film that can be formed by conventional CVD methods. After the deposition of the insulating layer 18, a via etching process is carried out to form a via hole 18a in the insulating layer 18. The via hole 18a exposes a top surface of the bottom electrodes 16a and 16b and a portion of the insulating layer 18 between the bottom electrodes 16a and 16b. According to the embodiment, the via hole 18a has substantially vertical sidewall with respect to the main surface of the substrate.

A magnetic material layer 20 is conformally deposited on the insulating layer 18 and on the interior surface of the via hole 18a by PVD or ALD methods. The magnetic material layer 20 is a thin film with uniform thickness and the magnetic material layer 20 does not fill up the via hole 18a. According to the embodiment, the magnetic material layer 20 is a pinned magnetic layer, which may be composed of a material including but not limited to NiFe, NiFeCo, CoFe, CoFeB, Fe, Co, Ni, alloys or compounds thereof, and/or other magnetic materials.

Figure 15:
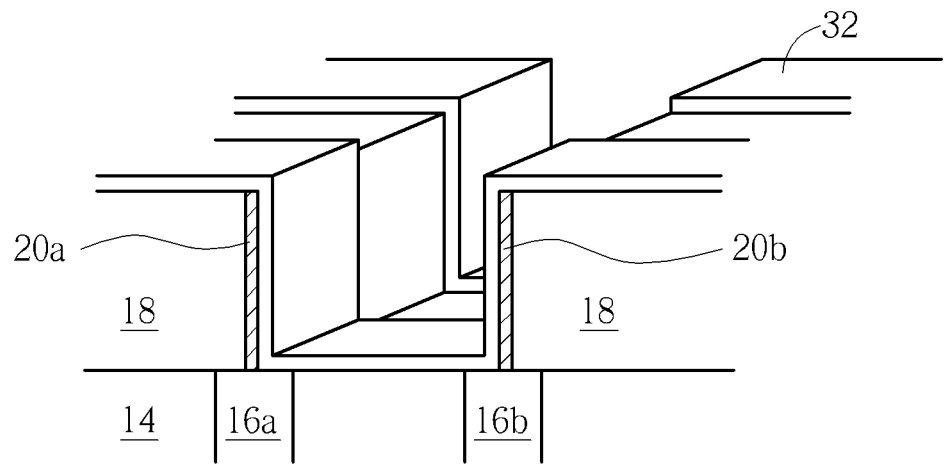

As shown in FIG. 15, an anisotropic dry etching process is then carried out to etch the magnetic material layer 20 thereby forming a sidewall spacer 20a and a sidewall spacer 20b extending vertically along two opposite sidewalls of the via hole 18a. The sidewall spacer 20a is situated directly above the bottom electrode 16a and the sidewall spacer 20b is situated directly above the bottom electrode 16b. The sidewall spacer 20a is separated from the sidewall spacer 20b. The magnetic material layer 20 outside the via hole 18a is removed to reveal the top surface of the insulating layer 18. Subsequently, a patterned sacrificial layer 32 such as silicon oxide, silicon nitride or photoresist is formed on the insulating layer 18 and the patterned sacrificial layer 32 covers a portion of the sidewall spacers 20a and 20b.

Figure 16:
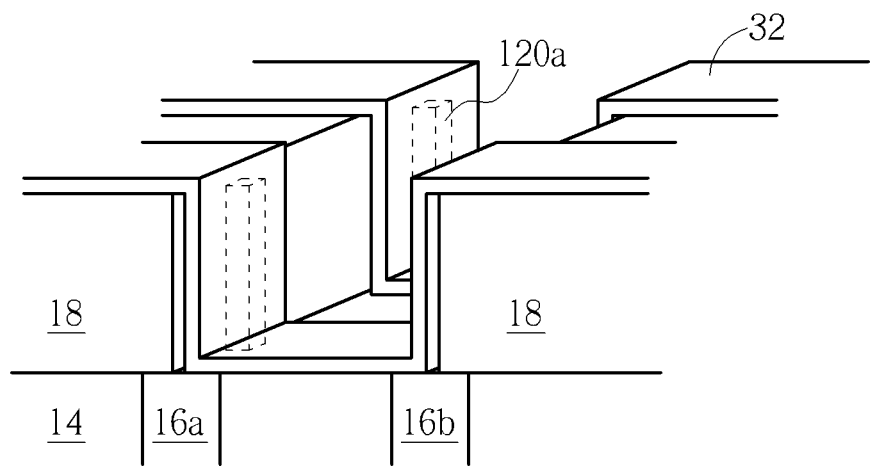

As shown in FIG. 16, a wet etching process is then carried out to etch the sidewall spacers 20a and 20b that are not covered with the patterned sacrificial layer 32. Thereafter, a portion of the sidewall spacer 20a under the patterned sacrificial layer 32 and a portion of the sidewall spacer 20b under the patterned sacrificial layer 32 are etched away to form a pillar 120a and a pillar 120b respectively on the bottom electrodes 16a and 16b. The pillar 120a and a pillar 120b act as a reference layer.

Figure 17:
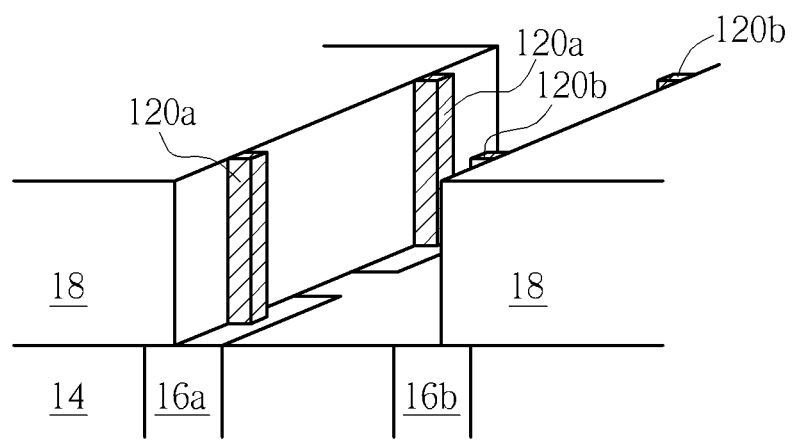

As shown in the FIG. 17, after the formation of the pillars 120a and 120b, the patterned sacrificial layer 32 is removed to reveal the pillars 120a and 120b. Removal of the patterned sacrificial layer 32 may be implemented by methods known in the art, for example, wet etching, dry etching or plasma ashing.

Figure 18:
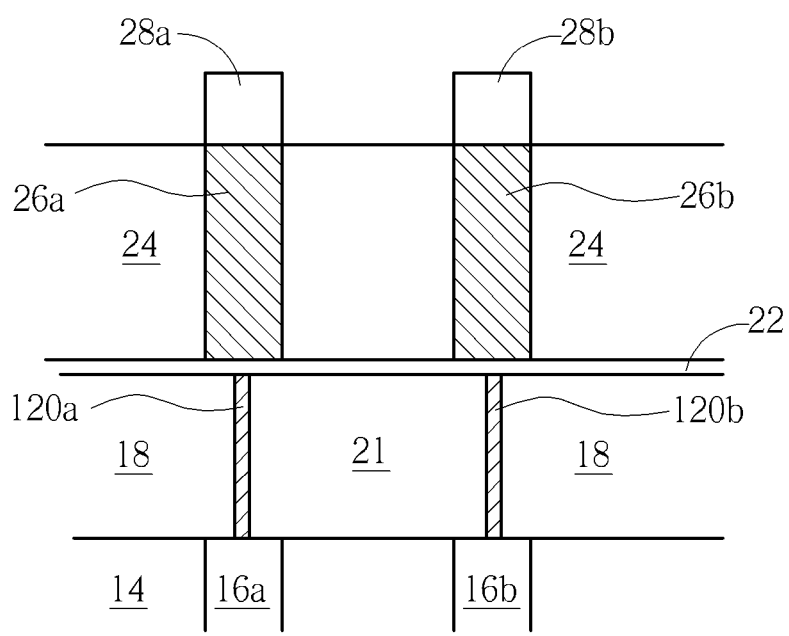

As shown in FIG. 18, an insulating layer 21 such as silicon oxide is then deposited. The insulating layer 21 fills up the remaining space in the via hole 18a and covers the pillars 120a and 120b and the top surface of the insulating layer 18. Thereafter, at least the insulating layer 21 outside the via hole 18a is removed by CMP. A barrier layer 22 such as MgO or $Al_2O_3$ is then deposited on the insulating layer 18 and the insulating layer 21. An insulating layer 24 such as silicon oxide is then deposited on the barrier layer 22. A free layer 26a and a free layer 26b are inlaid in the insulating layer 24. The free layer 26a is situated directly above the sidewall spacer 20a and the free layer 26b is situated directly above the sidewall spacer 20b. For example, a magnetic material layer is first deposited on the barrier layer 22 in a blanket manner. The magnetic material layer is then patterned to form the free layers 26a and 26b. Thereafter, the insulating layer 24 is deposited to cover the free layers 26a and 26b and the barrier layer 22. The excess insulating layer 24 may be removed by CMP. Top electrodes 28a and 28b are then formed on the free layers 26a and 26b respectively. The pillars 120a and 120b that act as the reference layer provide high polarization efficiency and magnetization efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a magnetoresistive random access memory (MRAM) element, comprising:
   providing a substrate;
   depositing a first insulating layer on the substrate;
   forming a first bottom electrode and a second bottom electrode in the first insulating layer, wherein the first bottom electrode is spaced apart from the second bottom electrode;
   depositing a second insulating layer on the first insulating layer and on the first and second bottom electrodes;
   forming a first via hole in the second insulating layer, wherein the first via hole exposes a top surface of the first and second bottom electrodes and a portion of the insulating layer between the first and second bottom electrodes;
   forming a first reference layer on a first sidewall in the first via hole and a second reference layer on a second sidewall in the first via hole;
   forming a patterned sacrificial layer on the first insulating layer and on the first and second reference layers;
   laterally etching the first and second reference layers from a side not masked by the patterned sacrificial layer, thereby turning the first and second reference layers into a first reference pillar and a second reference pillar respectively;
   removing the patterned sacrificial layer;
   filling the first via hole with a first gap fill material layer;
   depositing a barrier layer on the second insulating layer, the reference layer and the first gap fill material layer;
   depositing a third insulating layer on the barrier layer;
   forming a second via hole in the third insulating layer;
   forming a first free layer and a second free layer in the second via hole, wherein the first free layer is situated directly above the first reference pillar and the second free layer is situated directly above the second reference pillar;
   filling the second via hole with a second gap fill material layer; and
   forming a first and second top electrodes on the first and second free layers respectively.

2. The method for fabricating the MRAM element according to claim 1 wherein forming the first and second reference layers in the first via hole comprises the steps of:
   conformally depositing a magnetic material layer on the second insulating layer and on interior surface of the via hole; and
   anisotropically etching the magnetic material layer.

3. The method for fabricating the MRAM element according to claim 1 wherein after filling the first via hole with the first gap fill material layer, a chemical mechanical polishing (CMP) is carried out.

4. The method for fabricating the MRAM element according to claim 1 wherein forming the first and second free layers in the second via hole comprises the steps of:
   conformally depositing a magnetic material layer on the third insulating layer and on interior surface of the second via hole; and
   anisotropically etching the magnetic material layer.

5. The method for fabricating the MRAM element according to claim 1 wherein at least one semiconductor switching device is fabricated on the substrate.

6. The method for fabricating the MRAM element according to claim 5 wherein the bottom electrode is electrically connected to a terminal of the semiconductor switching device.

7. The method for fabricating the MRAM element according to claim 1 wherein the first and second reference layers are made of pinned magnetic material.

8. The method for fabricating the MRAM element according to claim 1 wherein the first and second reference layers comprise NiFe, NiFeCo, CoFe, CoFeB, Fe, Co, Ni, alloys or compounds thereof.

9. The method for fabricating the MRAM element according to claim 1 wherein the first and second free layers comprise NiFe, NiFeCo, CoFe, CoFeB, Fe, Co, Ni, alloys or compounds thereof.

10. The method for fabricating the MRAM element according to claim 1 wherein the barrier layer comprises MgO or $Al_2O_3$.

* * * * *